United States Patent
Hofmann et al.

(10) Patent No.: US 7,307,865 B2
(45) Date of Patent: Dec. 11, 2007

(54) INTEGRATED READ-ONLY MEMORY, METHOD FOR OPERATING SAID READ-ONLY MEMORY AND CORRESPONDING PRODUCTION METHOD

(75) Inventors: Franz Hofmann, Muchen (DE); Richard Johannes Luyken, Muchen (DE); Till Schlosser, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/505,320

(22) PCT Filed: Feb. 17, 2003

(86) PCT No.: PCT/EP03/01583

§ 371 (c)(1),
(2), (4) Date: May 5, 2005

(87) PCT Pub. No.: WO03/075350

PCT Pub. Date: Sep. 12, 2003

(65) Prior Publication Data

US 2005/0201187 A1    Sep. 15, 2005

(30) Foreign Application Priority Data

Feb. 21, 2002    (DE) ............................... 102 07 300

(51) Int. Cl.
*G11C 17/00* (2006.01)
(52) U.S. Cl. ..................... 365/100; 365/104; 365/151
(58) Field of Classification Search ............. 365/100, 365/104, 151
See application file for complete search history.

(56) References Cited

U.S. PATENT DOCUMENTS

| | | | |
|---|---|---|---|
| 4,590,589 A | | 5/1986 | Gerzberg |
| 5,231,602 A | * | 7/1993 | Radjy et al. ............. 365/185.3 |
| 5,363,329 A | | 11/1994 | Troyan |
| 5,812,441 A | | 9/1998 | Manning |
| 5,978,258 A | | 11/1999 | Manning |
| 2002/0196652 A1 | | 12/2002 | Mills, Jr. |

OTHER PUBLICATIONS

C.P Collier et al, "Electronically Configurable Molecular-Based Logic Gates", Science, vol. 285, pp. 391-394, (1999).
C.P. Collier et al, "A [2]Catenane-Based Solid State Electronically Reconfigurable Switch", Science, vol. 289, pp. 1172-1175, (2000).
D.I. Gittins et al., "A Nanometre-Scale Electronic Switch Consisting of a Metal Cluster and Redox-Addressable Groups", Nature, vol. 408, pp. 67-69, (2000).
G. Wicker et al., "Nonvolatile, High Density, High Preformance Phase Change Memory", www.Ovonyx.com, 9 pages (1999).
A. Beck et al., "Reproducible Switching Effect in Thin Oxide Films for Memory Applications", Applied Physics Letters, vol. 77, pp. 139-141, (2000).
H.J. Gao et al., "Reversible, Nanometer-Scale Conductance Transitions in an Organic . . .", Physical Review Letters, vol. 84, No. 8, pp. 1780-1783, (2000).

* cited by examiner

*Primary Examiner*—Huan Hoang
(74) *Attorney, Agent, or Firm*—Brinks Hofer Gilson & Lione

(57) ABSTRACT

An integrated read-only memory having select transistors, each of which has a drain connection and an electrode connection for feeding an electrical signal such as a voltage or a current. A layer is provided between the drain connections and the electrode, whose electric resistance can be changed under the effect of a configuration voltage or current. The layer may be applied in a backend process.

38 Claims, 3 Drawing Sheets

INTEGRATED READ-ONLY MEMORY, METHOD FOR OPERATING SAID READ-ONLY MEMORY AND CORRESPONDING PRODUCTION METHOD

PRIORITY AND CROSS REFERENCE TO RELATED APPLICATIONS

This application is related to and claims the benefit of priority under 35 U.S.C. §§ 120, 365, and 371 to Patent Cooperation Treaty patent application no. PCT/EP03/01583, filed on Feb. 17, 2003, which was published at WO 03/075350, in German.

This application is further related to and claims the benefit of priority of Feb. 21, 2002 under 35 U.S.C. § 119 to German patent application no. DE 102 07 300.7, filed on Feb. 21, 2002.

BACKGROUND OF THE INVENTION

1. Technical Field

The invention relates to an integrated read-only memory, a method for operating said read-only memory and a method for producing an integrated read-only memory.

2. Related Art

As the integration density in microelectronics increases, the demand for large-scale integrated read-only memories is also increasing. These memories are used for example for on-chip storage of audio, graphics or video data.

Read-only memories are distinguished by the fact that the memory content is preserved even when the operating voltage is switched off. Such read-only memories are, in particular, also of programmable design (PROM). Programmable components therefor are for instance fuses, diodes or, alternatively, special MOSFETs having an additional so-called floating gate. The latter is charged during programming and thereby shifts the threshold voltage of the MOSFET. Since the floating gate is insulated all around with $SiO_2$, the charge retention can be guaranteed for approximately ten years.

Over and above the programming function, there are read-only memory variants which are of erasable design (EPROM, EEPROM). The memory content can be erased by means of ultraviolet light in the case of EPROMs; the erase function is effected electrically in the case of EEPROMs.

Flash memories constitute a particular embodiment of erasable read-only memories. They are electrically erasable, in which case, rather than being able to erase the individual memory cells separately, it is only possible to erase a whole block on the chip at once. In this case, the erasure is effected by means of a single erase pulse that lasts a few seconds. The advantage in this case is that the memory chip, for erasure, does not have to be demounted and placed into an erase device.

Integrated memories are usually constructed in the form of arrays. So-called selection transistors are used to select individual memory elements, so that their content can be read out. Individual selection transistors are selected via word lines. In this case, the word lines are connected to the control electrodes of selection transistors. The memory content is read out via bit lines. Writing to or configuring memory cells usually requires additional lines for accessing the memory element. This enlarges the construction of integrated read-only memories and makes them more complicated to handle.

An article by C. P. Collier et al., *Electronically Configurable Molecular-Based Logic Gates*, Science, Volume 285, p. 391, 1999 discloses an electronically configurable connection having a molecular monolayer between two contacts produced lithographically. In this case, the contacts are formed as Al—Ti electrodes. Rotaxane molecules are used as the molecular layer.

The electrical behavior of this connection can be described as follows: if a layer is negatively polarized, then the current at the connection rises with increasing negative polarity. Such a treatment of the electrical connection changes the switching behavior to the effect that now only a current that is lower by a factor of 60 to 80 is measurable in the case of a negatively polarized layer than without the prior treatment of the connection with a positively polarized layer.

The connection may thus be understood as a switch which may have an open state (poorer conductivity) and also a closed state (better conductivity). The open state permits a current flow at negative voltage on account of a resonance tunnel effect in the rotaxane-electrode junction. The switch's transition from the open state to the closed state through application of a sufficient positive voltage is irreversible, with the result that a switch, once closed, can no longer assume an open state.

The connection is disclosed for use in logic circuits.

A further electronically configurable switch is disclosed in C. P. Collier et al., *A [2]Catenane-Based Solid State Electronically Reconfigurable Switch*, Science, Volume 289, p. 1172, 2000: the electrodes used are a polycrystalline silicon electrode, on the one hand, and a metal electrode, on the other hand. A molecular monolayer between the electrodes contains Catenane.

Operation of the switch exploits the effect that mechanically blocked, intermeshing molecular rings of the catenane are shifted relative to one another upon oxidation and subsequent reduction and the electrical properties of the switching connection are thereby changed. This voltage-controlled shift is reversible. The configuration is thus effected along a hysteresis loop. Depending on the previously applied configuration voltage, it is possible to observe a specific switching behavior upon application of a predetermined read voltage.

A further embodiment of a molecularly constructed switch is revealed in D. I. Gittins et al., *A Nanometre-Scale Electronic Switch Consisting of a Metal Cluster and Redox-Addressable Groups*, Nature, Volume 408, p. 67, 2000. Here, too, the electron transport is controlled by means of molecular paths. A bipyridinium compound is used as the molecular layer.

A metal-insulator-metal arrangement is proposed in A. Beck et al., *Reproducible Switching Effect in Thin Oxide Films for Memory Applications*, Applied Physics Letters, Volume 77, p. 139, 2000. An insulator oxide, for instance $SrZrO_3$ or $SrTiO_3$ or $Ca_2Nb_2O_7$, is applied as an epitaxial or polycrystalline film onto an $SrRuO_3$ film or a Pt film as electrode. The top electrode made of Au or Pt is applied onto the insulator via a Ti layer.

A read access to the switching arrangement is effected in a voltage range of −0.5 Volt to +0.5 Volt in the case of $SrZrO_3$ as insulator doped with 0.2 Cr. The current/voltage relationship is approximately linear in this read voltage range. The current flow over this voltage range depends on the previous configuration of the insulator. The insulator is configured by application of voltages of +1 Volt or −1 Volt over a duration of 2 ms. Through application of the negative configuration voltage, the insulator flips into its low-impedance state and in this case has a resistance characteristic curve that differs significantly from the resistance characteristic curve after application of the positive configuration voltage. Through application of the positive configuration voltage, the insulator flips into its high-impedance state. The configuration is reversible.

The change in the resistance characteristic curves that is brought about by configuration voltage pulses is caused by a change between amorphous and crystalline insulator states.

G. Wicker et al., Nonvolatile, High Density, High Performance Phase Change Memory, www.Ovonyx.com reveals chalcogenide alloys that are configured by controlled heating and cooling. In this case, the application of a voltage pulse brings about a change between amorphous and crystalline states, and vice versa.

H. J. Gao et al., Reversible, Nanometer-Scale Conductance Transitions in an Organic . . . ", Physical Review Letters, Volume 84, No. 8, p. 1780, 2000 uses a complex comprising 3-nitrobenzal malonitrile and 1,4-phenylenediamine as a layer whose conductivity can be changed on account of a change between crystalline and amorphous states.

U.S. Pat. No. 4,590,589 discloses an electrically programmable read-only memory having voltage-programmable structures produced in finished fashion, for the provision of predictable and selectable programming voltages.

BRIEF SUMMARY

The invention relates to an integrated read-only memory which has a high integration density and can be programmed in a small number of steps.

Furthermore, the invention relates to a method for producing such an integrated read-only memory.

An embodiment of an integrated read-only memory may have selection transistors each having a drain connection, an electrode for feeding a voltage or a current, a layer between the drain connections and the electrode, the electrical resistance of which can be changed through the effect of a configuration voltage or a configuration current, a source connection per selection transistor, a bit line that is electrically connected to at least one source connection, in which the layer is formed as a common layer for linking the drain connections to the electrode, and the electrical resistance of the layer can be changed locally.

An embodiment of an operating method may include producing an array of selection transistors using CMOS technology, leadin drain contacts of the selection transistors to the surface of the arrangement, depositing a layer whose electrical resistance can be changed through the effect of a configuration voltage or a configuration current, it being possible for the electrical resistance of the layer to be changed locally, arranging an electrode above the layer, forming a source connection per selection transistor, forming a bit line which is electrically connected to at least one source connection, where the layer is deposited as a common layer for linking the drain connections to the electrode.

An embodiment of the method may also included depositing a layer as a common layer for linking the drain connections to the electrode above the selection transistors.

The foregoing discussion of the summary is provided only by way of introduction. Other systems, methods, processes, apparatuses, features and advantages of the invention will be, or will become, apparent to one with skill in the art upon examination of the following figures and detailed description. It is intended that all such additional systems, methods, features and advantages be included within this description, be within the scope of the invention, and may be realized and obtained by means of the instrumentalities and combinations particularly pointed out in the claims.

BRIEF DESCRIPTION OF THE DRAWINGS

This invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
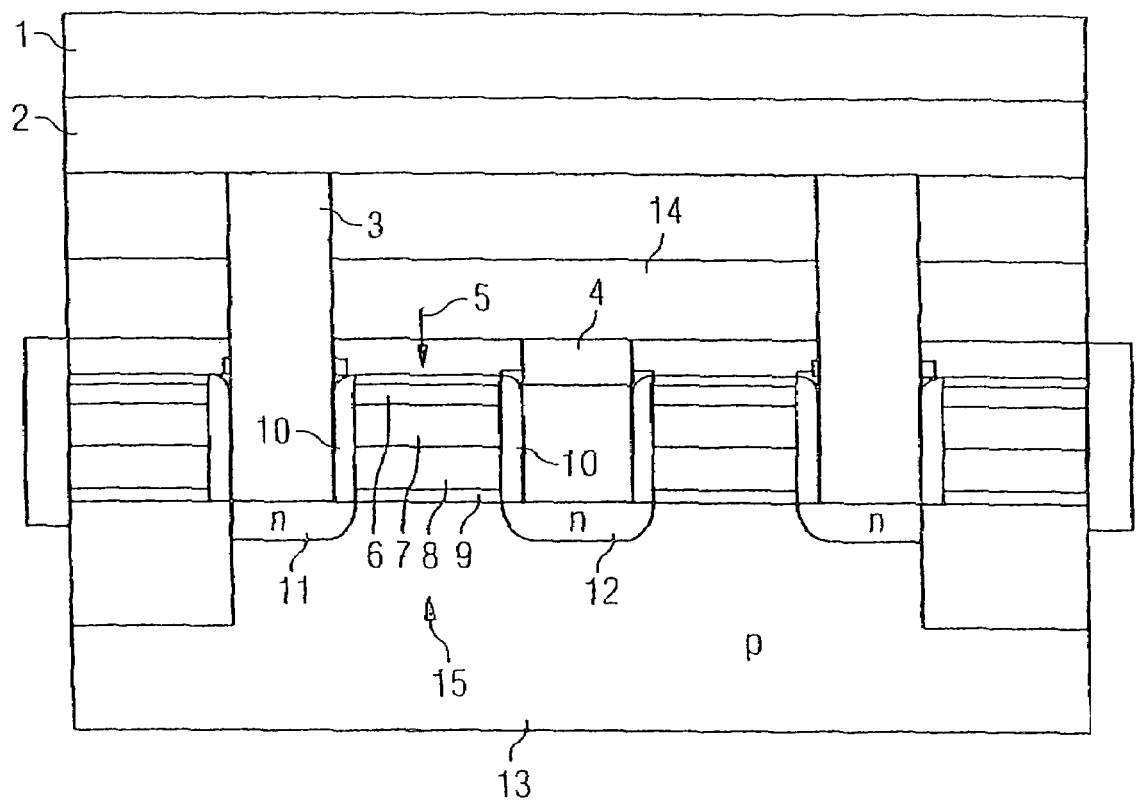
FIG. 1 shows a cross section through part of an integrated read-only memory in accordance with a first exemplary embodiment of the invention using planar selection transistors.

Exemplary embodiments of the invention are illustrated in the drawings and explained in more detail in the description below. Identical elements are identified by the same reference symbols throughout the figures.

The read-only memory according to the invention may include selection transistors each having a drain connection and also an electrode for feeding a voltage or a current. A layer is provided between the drain connections and the electrode. The electrical resistance of the layer can be changed through the effect of a configuration voltage or a configuration current.

Thus, the use of a layer whose electrical resistance or whose electrical conductivity can be changed by electrical configuration is proposed. Through the effect of a configuration current or a configuration voltage, the electrical property of "resistance" or "conductivity" of the layer is set, so that the setting can be interrogated in a read step.

Switching elements of the integrated read-only memory thus formed need only have two connections, more precisely the electrode connection and the connection to the drain of the respective selection transistor. Via these two connections, the intervening layer used as memory element can both be configured—also used as a synonym for "written to" or "programmed"—by suitable application of voltage or current and its content—represented by a specific layer state—can be read out. Configuration connection and read connection no longer have to be provided separately from one another.

This measure may allow the integration density to be considerably increased. Since each memory cell can be driven individually, the driving can be effected at high speeds. Moreover, the selection of suitable material systems makes it possible to use low operating voltages, at least lower operating voltages than in the case of conventional flash memory technologies.

When a memory cell's selection transistor is driven via the gate, the content is read out via a bit line connected to the source. The current flow from the electrode via the electrically switchable layer and the drain-source path of the selection transistor to the bit line is a measure of the content of the memory cell. In this case the current flow is significantly influenced by the preset state of the layer, more precisely its resistance characteristic.

Such a memory cell can be programmed by selection of the corresponding selection transistor and subsequent application of a configuration voltage between electrode and bit line, or, alternatively, by variation in the gate driving of the selection transistor with a voltage applied to the electrode. If the programming is irreversible, it is possible to realize a one-time programmable memory, and a read-only memory that can be written to many times can be realized if the state change is reversible.

Preferably, the layer is formed as a common layer for linking the drain connections, and in particular all the drain connections, to the electrode. Consequently, only a single electrically switchable layer may be provided, to which a plurality or even all of the drain connections of selection transistors are connected, that is to say are electrically conductively connected thereto. In this advantageous development of the invention, it is assumed that the common layer can be changed locally in terms of its electrical properties and is thus programmable. Thus, individual delimitable local regions of the layer may have differing conductivity. Precisely such a region then forms a memory cell to which a selection transistor is connected. The electrode is preferably formed as a common electrode above said layer.

This significantly simplifies the production process but also significantly increases the integration density.

Preferably, the resistance of the layer can be switched over.

This development of the invention aims for the best possible discrimination between the conductivity values of the layer states that can be set.

Preferably, the resistance of the layer can be switched over between two resistance characteristic curves. It is assumed in this case that, in the read operation, the resistance is not constant over a read voltage range that can be applied, but rather follows a characteristic curve. In this case the characteristic curves assigned to the layer states are intended to be well discriminatable.

The read operation of the memory cell is distinguished by a read voltage applied to the layer or a read current fed to the layer within a defined voltage or current range. In contrast thereto, the configuration operation may have a configuration voltage or a configuration current preferably outside the voltage or current range provided for read operation.

In this case, configuration and read operation can be effected in completely different voltage or current bands and incorrect operation can thus be avoided.

Preferably, the integrated read-only memory is designed as a flash memory. In this case, by the application for example of a configuration voltage to the electrode and simultaneous activation of all the selection transistors, it is possible for all of the local memory areas of the electrically switchable layer to be put into the same state with regard to the conductivity.

A fast erasure of the memory content is thus possible.

The bit lines connected to source connections of the selection transistors may be connected to a decoder circuit. For this purpose, the bit line may be formed in particular in a manner accessible for an external connection.

Each gate connection of a selection transistor may be electrically connected to a word line.

The word line, for its part, may be connected to a decoder circuit. In this case, the word line may, in particular, be accessible for an external connection.

These embodiments serve for the selection of selection transistors in multiplex operation with decoders that determine the addresses being connected upstream.

The selection transistors are arranged on the substrate preferably in an array.

In this case, the selection transistors may have a planar construction in the substrate.

By virtue of the planar construction, an integration density that is increased somewhat compared with the vertical construction of the transistors is accepted in favor of simplified production steps. The integration density of a memory cell in the case of a planar arrangement of the selection transistors amounts for example to approximately $6*F^2$ or $8*F^2$, where F is the minimum feature size.

In the case of a vertical construction of the selection transistors in the substrate, the integration density of a memory cell amounts to approximately $4*F^2$, where F is the minimum feature size.

Preferably, the electrically switchable layer is formed as a molecular layer, and in particular is formed as a monolayer as is known in the art. The layer may include rotaxane, catenane, and/or a bispyridinium compound, and the like or any combination thereof. For example, the monolayer may be formed as described in C. P. Collier et al., *Electronically Configurable Molecular-Based Logic Gates*, Science, Volume 285, p. 391, 1999; C. P. Collier et al., *A [2]Catenane-Based Solid State Electronically Reconfigurable Switch*, Science, Volume 289, p. 1172, 2000; and/or D. I. Gittins et al., *A Nanometre-Scale Electronic Switch Consisting of a Metal Cluster and Redox-Addressable Groups*, Nature, Volume 408, p. 67, 2000; each of which is incorporated by reference herein in their entirety.

The layer may also be formed as a dielectric, using an oxide component, as is known in the art. The layer may include $SrZrO_3$, or alternatively $(Ba.Sr)TiO_3$ or $SrTiO_3$ or $Ca_2Nb_2O_7$ or $Ta_4O_5$, if appropriate doped in a suitable manner, for example with Cr. For example, the dielectric layer may be formed as described in A. Beck et al., *Reproducible Switching Effect in Thin Oxide Films for Memory Applications*, Applied Physics Letters, Volume 77, p. 139, 2000, which is incorporated by reference herein in their entirety.

The layer may also be formed as a polymer, as is known in the art. The layer may include a 3-nitrobenzal malonitrile, 1,4-phenylenediamine complex or chalcogenide material. For example, the polymer layer may be formed as described in H. J. Gao et al., *Reversible, Nanometer-Scale Conductance Transitions in an Organic . . .* ", Physical Review Letters, Volume 84, No. 8, p. 1780, 2000; and G. Wicker et al., *Nonvolatile, High Density, High Performance Phase Change Memory*, www.Ovonyx.com, both of which are incorporated by reference herein in their entirety.

In order to produce an integrated read-only memory, firstly an array of selection transistors is produced using CMOS-compatible technology. Drain contacts of the selection transistors are led to the surface of the arrangement before a layer whose electrical resistance can be changed through the effect of a configuration voltage or a configuration current is deposited above the selection transistors. Finally, an electrode is arranged above the layer.

Consequently, a large-scale integrated memory can be produced in a simple manner.

In particular with a common layer for a plurality or all of the memory cells, said layer may be deposited in just one production step.

In this case, the selection transistors may be produced in a front end process and the layer may be deposited in a back end process. In this case, back end process is understood to be the chronologically last fabrication stages in semiconductor fabrication, in particular the fabrication stages after the construction of structures in the substrate.

In this case, the integration of the switchable layer in the back end process affords significant advantages in particular for organic compounds, since the switchable layer is not exposed to the temperatures in the region of up to 1000 Celsius that are customary in the front end process. Furthermore, the use of an unpatterned top electrode avoids possible damage to the electrically switchable layer by one of the patterning techniques.

The selection transistors may be constructed in planar fashion in the substrate, or alternatively vertically. In the case of planar orientation it is possible to use standard processes for production.

With regard to the layer materials and their particular features and advantages, reference is made to the explanations concerning the integrated read-only memory.

FIG. 1 shows a cross section through part of an integrated read-only memory in accordance with a first exemplary embodiment of the invention.

In this case, the read-only memory contains an n-channel MOSFET as selection transistor 15. In this case, an N-type drain region 11 and an N-type source region 12 are created by doping in a p-type substrate. A gate 5 with a polysilicon gate 8 and also a tungsten layer 7 and a nitride layer 6 thereabove is applied, in a manner insulated by an oxide layer 9 above the channel between drain region 11 and source region 12.

Oxide spacers 10 insulate the gate 5 laterally from a source connection 4, predominantly produced from polysilicon, and also a drain connection 3, which is led upward as a metallic plug.

Source connection 4 and drain connection 3 make contact with the source region 12 and the drain region 11, respectively, in the substrate 13.

At the other end, the source connection 4 is connected to a bit line 14. For its part, the drain connection 3 is connected to an electrically switchable layer 2, for example a rotaxane molecular layer, which, for its part, is covered by an electrode 1.

Further selection transistors adjoin on both sides of the planar selection transistor 15. Thus, by way of example, a further drain connection of a selection transistor is shown on the right-hand side, which is likewise connected to the layer 2.

The arrangement according to FIG. 1 therefore only shows a detail from an array of memory cells of a read-only memory, in particular only a marked memory cell with a selection transistor 15 and an associated section—around the drain connection 3—of the layer 2 as memory element which can be locally configured in this region.

In particular, the resistance of the layer 2 can in this case be changed locally through the effect of a voltage present at the electrode 1. Consequently, the local electrical behavior of the layer 2 can be set once or repeatedly depending on the chemical composition of the layer material by means of voltage or current pulses. The totality of this electrically switchable layer constitutes the actual memory elements which are represented by local regions in the layer with different resistance characteristic values. In particular, it can be discerned that the drain connections 3 of a plurality of selection transistors are connected to this common layer 2, and, consequently, a single layer that can be differently configured locally in terms of its electrical properties holds all the memory contents ready.

The gate 5 is connected to a word line (not depicted). In order to read out the content of the memory cell represented, the gate 5 is activated via the word line. A predetermined read voltage is present at the electrode. The memory content is tapped off at the bit line during the gate driving. If the rotaxane layer 2 is programmed as an open switch, then in the case of a read voltage which effects a negative polarity in the layer, the layer 2 permits a current flow that is detected on the bit line. However, if the rotaxane layer is programmed as a closed switch, i.e. a positive voltage of greater than 0.7 Volt has already been applied to the electrode, then the rotaxane layer 2, on account of its molecular state, no longer permits a current flow, this likewise being detected on the bit line.

During the production of such an integrated read-only memory, first the selection transistors are created in standard CMOS processes. After preparation of the source and drain connections 4 and 3, the electrically switchable layer 2 is applied in the back end process, before said layer 2 is covered with the electrode 1.

Figure 2:
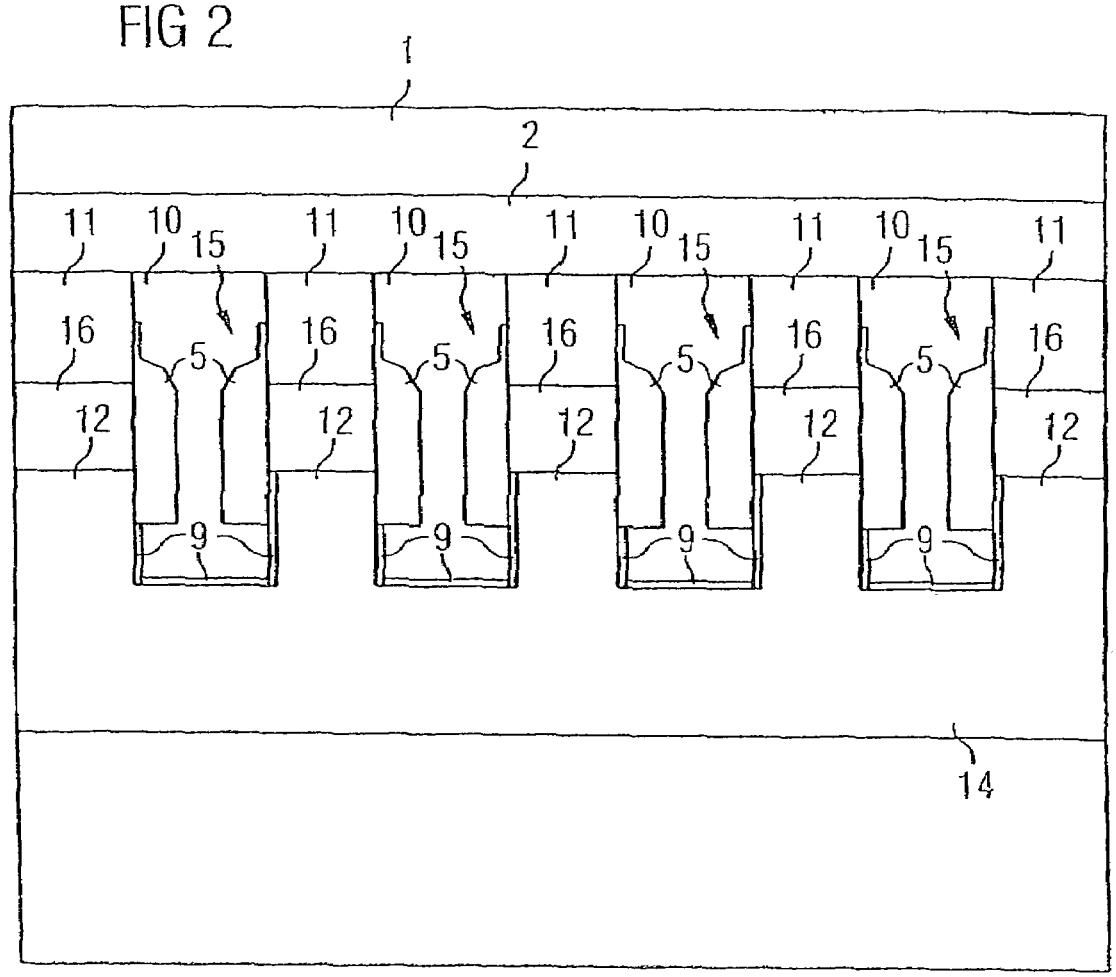
FIG. 2 shows a cross section through part of an integrated read-only memory in accordance with a first exemplary embodiment of the invention using vertical selection transistors.

FIG. 2 shows a cross section through part of an integrated read-only memory in accordance with a second exemplary embodiment of the invention.

In contrast to the exemplary embodiment according to FIG. 1, the selection transistors 15 are now arranged vertically in the substrate 13.

An N-type source region 12, a P-type region 16 and an N-type drain region 11 are arranged one above the other. On lateral vertical oxide layers 9, vertical gates 5 made of polysilicon are arranged on both sides of the above-described stack. Oxide spacers 10 are provided for insulation purposes between the gates 5 of adjacent vertical selection transistors 15.

The N-type drain regions 11 are again connected to the electrically switchable layer 2 that has already been described in more detail in connection with FIG. 1, the electrode 1 again being applied on said layer.

The N-type source regions are again connected to bit lines 14 arranged below the selection transistors 15.

The word lines connected to the gates 5 are again not depicted.

The layer 2 is applied to the vertical transistor arrangements according to FIG. 2 in the back end process.

Figure 3:
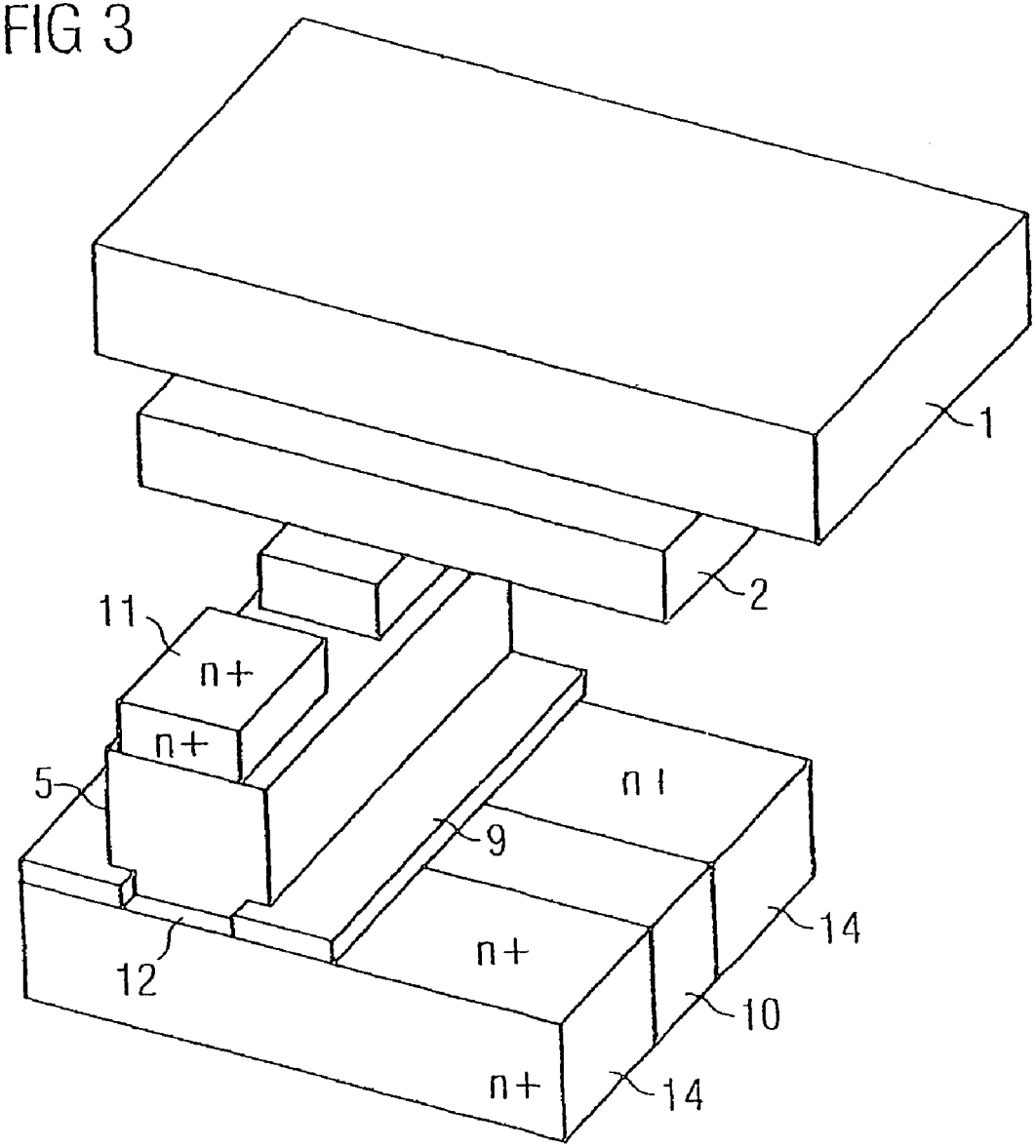
FIG. 3 shows a perspective view with elements illustrated partly in exploded fashion in a detail from a read-only memory according to FIG. 2.

FIG. 3 shows a detail from an integrated read-only memory according to FIG. 2, in the picture only with a single vertical selection transistor 15, in an exploded illustration.

In this case, layer 2 and electrode 1 are lifted off in exploded fashion from the single selection transistor 15.

In particular, it is possible to see the structure and arrangement of bit lines 14 that are mutually insulated among one another by oxide spacers 10.

The invention claimed is:

1. An integrated read-only memory, comprising:
   selection transistors, each selection transistors having a drain connection; an electrode for feeding a voltage or a current;
   a common layer between the drain connections and the electrode electrically linking the drain connections to the electrode, wherein the electrical resistance of the common layer is changeable by a configuration voltage or a configuration current;
   a source connection per selection transistor; and
   a bit line that is electrically connected to at least one source connection.

2. The read-only memory of claim 1, wherein resistance of the common layer is configured to be switched over.

3. The read-only memory of claim 1 or 2, wherein the resistance of the common layer is switchable between two resistance characteristic curves.

4. The read-only memory of claim 1 further comprising:
a read voltage applied to the common layer or a read current fed to the layer within a defined voltage or current range in a read Operation of the read-only memory, and
a configuration voltage or a configuration current outside the voltage or current range provided for the read Operation in a configuration operation of the read-only memory.

5. The read-only memory of claim 1, wherein the read-only memory comprises a flash memory.

6. The read-only memory of claim 1, wherein the selection transistors are arranged in an array.

7. The read-only memory of claim 1, wherein the bit line is connected to a decoder circuit.

8. The read-only memory of claim 1, wherein the bit line is accessible for an external connection.

9. The read-only memory of claim 1, further comprising: a gate connection per selection transistor, and a word line that is electrically connected to at least one gate connection.

10. The read-only memory of claim 9, wherein the word line is connected to a decoder circuit.

11. The read-only memory of claim 9, wherein the word line is accessible for an external connection.

12. The read-only memory of claim 1, wherein the selection transistors have a planar construction in the substrate.

13. The read-only memory of claim 1, wherein the selection transistors have a vertical construction in the substrate.

14. The read-only memory of claim 1, wherein the common layer comprises a molecular layer.

15. The read-only memory of claim 14, wherein the common layer includes rotaxane.

16. The read-only memory of claim 14, wherein the common layer includes catenane.

17. The read-only memory of claim 14, wherein the common layer includes a bispyridinium compound.

18. The read-only memory of claim 1, wherein the common layer comprises a dielectric.

19. The read-only memory of claim 18, wherein the common layer includes $SrZrO_3$.

20. The read-only memory of claim 1, wherein the common layer comprises a polymer.

21. The read-only memory of claim 20, wherein the common layer includes 3-nitrobenzal malonitrile, 1,4-phenylenediamine complex.

22. The read-only memory of claim 20, in which the common layer includes a chalcogenide compound.

23. A method for operating an integrated read-only memory comprising selection transistors, each selection transistor having a drain connection; an electrode for feeding a voltage or a current; a common layer between the drain connections and the electrode electrically linking the drain connections to the electrode, the electrical resistance of the layer is changeable by a configuration voltage or a configuration current; a source connection per selection transistor; and a bit line that is electrically connected to at least one source connection, the method comprising:
applying, in a read operation, a read voltage or a read current within a defined voltage or current range is applied to the common layer; and
applying, in a configuration operation, a configuration voltage or a configuration current outside the voltage or current range provided for the read operation to the common layer.

24. A method for producing an integrated read-only memory, the method comprises:
producing selection transistors, each selection transistor having a drain contact;
arranging an electrode;
providing a common layer between the drain connections and the electrode electrically linking the drain connections to the electrode, wherein the electrical resistance of the common layer is changeable by a configuration voltage or a configuration current;
forming a source connection per selection transistor; and
forming a bit line which is electrically connected to at least one source connection.

25. The method for producing an integrated read-only memory of claim 24, wherein the selection transistors are produced in a front end process.

26. The method for producing an integrated read-only memory of claim 24, wherein the common layer is deposited in a back end process.

27. The method for producing an integrated read-only memory of claim 24, wherein the selection transistors are constructed in planar fashion in the substrate.

28. The method for producing an integrated read-only memory of claim 24, wherein the selection transistors are constructed vertically in the substrate.

29. The method for producing an integrated read-only memory of claim 24, wherein providing a common layer comprises providing a molecular layer.

30. The method for producing an integrated read-only memory of claim 29, wherein the common layer includes rotaxane.

31. The method for producing an integrated read-only memory of claim 29, wherein the common layer includes catenane.

32. The method for producing an integrated read-only memory of claim 29, wherein the common layer includes a bispyridinium compound.

33. The method for producing an integrated read-only memory of claim 24, wherein providing a common layer comprises providing a dielectric.

34. The method for producing an integrated read-only memory of claim 33, wherein the common layer includes $SrZrO_3$.

35. The method for producing an integrated read-only memory of 24, wherein providing a common layer comprises providing a polymer.

36. The method for producing an integrated read-only memory of claim 35, wherein the common layer includes a 3-nitrobenzal malonitrile, 1.4-phenylenediamine complex.

37. The method for producing an integrated read-only memory of claim 28, wherein the common layer includes a chalcogenide compound.

38. The method for producing an integrated of claim 24, wherein the selection transistors are produced using CMOS technology.

* * * * *

UNITED STATES PATENT AND TRADEMARK OFFICE
CERTIFICATE OF CORRECTION

PATENT NO. : 7,307,865 B2  Page 1 of 1
APPLICATION NO. : 10/505320
DATED : December 11, 2007
INVENTOR(S) : Franz Hofmann et al.

It is certified that error appears in the above-identified patent and that said Letters Patent is hereby corrected as shown below:

On the Title Page

Item (75), after "Hofmann," delete "Muchen" and substitute --München-- in its place.

Item (75), after "Luyken," delete "Muchen" and substitute --München-- in its place.

Column 10, in claim 35, line 2, after "memory of" insert --claim--.

Column 10, in claim 36, line 3, immediately before "-phenylenediamine" delete "1.4" and substitute --1,4-- in its place.

Column 10, in claim 38, line 1, after "an integrated" insert --read-only memory--.

Signed and Sealed this

Eighth Day of July, 2008

JON W. DUDAS
*Director of the United States Patent and Trademark Office*